(12) United States Patent
Loke et al.

(10) Patent No.: US 7,280,002 B2
(45) Date of Patent: Oct. 9, 2007

(54) METHOD AND APPARATUS FOR BIASING A METAL-OXIDE-SEMICONDUCTOR CAPACITOR FOR CAPACITIVE TUNING

(75) Inventors: Alvin Leng Sun Loke, Fort Collins, CO (US); Tin Tin Wee, Fort Collins, CO (US); Robert Keith Barnes, Fort Collins, CO (US); Kari Lee Arave, Fort Collins, CO (US); Thomas Edward Cynkar, Fort Collins, CO (US); James Ruhl Pfiester, Fort Collins, CO (US)

(73) Assignee: Avago Technologies General IP Pte Ltd, Singapore (SG)

( * ) Notice: Subject to any disclaimer, the term of this patent is extended or adjusted under 35 U.S.C. 154(b) by 156 days.

(21) Appl. No.: 11/070,985

(22) Filed: Mar. 3, 2005

(65) Prior Publication Data
US 2006/0197623 A1    Sep. 7, 2006

(51) Int. Cl.
*H03B 5/12*    (2006.01)

(52) U.S. Cl. .................... 331/177 V; 331/36 C

(58) Field of Classification Search ............ 331/177 V, 331/36 C
See application file for complete search history.

(56) References Cited

U.S. PATENT DOCUMENTS

| 6,426,854 | B1* | 7/2002 | Allen ........................ 361/56 |
| 2002/0014925 | A1* | 2/2002 | Ochiai ................. 331/117 FE |
| 2003/0222698 | A1* | 12/2003 | Khieu et al. ............... 327/328 |
| 2005/0030116 | A1* | 2/2005 | Takagi ................... 331/177 V |

* cited by examiner

*Primary Examiner*—Joseph Chang

(57) ABSTRACT

A method and apparatus is presented for generating a reference voltage that biases a metal-oxide-semiconductor (MOS) transistor used as a varactor in capacitive tuning applications. In one embodiment, a biasing circuit is implemented. The biasing circuit comprises a diode-clamped FET and an element coupled to the diode-clamped FET at a connection point. The element produces a constant current through the diode-clamped FET. A voltage is produced at the connection point. The voltage is one gate overdrive plus a threshold voltage above ground or one gate overdrive plus a threshold voltage below VDD. Establishing a threshold voltage in this way enables the biasing circuit to track an ideal voltage of a varactor that is coupled to the biasing circuit through the threshold voltage.

17 Claims, 17 Drawing Sheets

METHOD AND APPARATUS FOR BIASING A METAL-OXIDE-SEMICONDUCTOR CAPACITOR FOR CAPACITIVE TUNING

BACKGROUND OF THE INVENTION

Description of the Related Art

The use of reference voltage generators is ubiquitous and essential in the design of analog circuits. One particular type of voltage reference circuit biases varactors in a voltage-controlled oscillator. In conventional circuits, a voltage-controlled oscillator is often employed in phase-locked loops to generate an output frequency that exhibits a known phase and frequency relationship to some input reference clock frequency through negative feedback control. The output of the phase-locked loop thus controllably synthesizes some output frequency that tracks some input frequency.

In conventional integrated circuits (ICs), metal-oxide-semiconductor (MOS) field-effect transistors (FETs) are commonly used as varactors or voltage-tunable variable capacitors for tuning the output frequency of a voltage-controlled oscillator (VCO) in a phase-locked loop (PLL). Also known as inversion-mode MOS varactors, the small-signal capacitance of a MOS varactor is modulated as the device transitions between inversion mode and depletion mode of operation where the capacitance is respectively maximum and minimum.

FIG. 1A displays a conventional n-channel MOSFET (nFET) configured as an n-channel MOS varactor for tuning a VCO. The n-channel MOS varactor is configured such that the gate is biased to the supply voltage (VDD) and the capacitance is controlled by a control voltage applied to a common source-drain connection. Configuring the n-channel MOS varactor in this way produces the capacitance-voltage (C-V) characteristic curve shown in FIG. 1B. In a typical VCO application such as in a resonant LC (inductor-capacitor) based VCO, such a varactor would be configured with the gate tied to the resonant tank having VDD as the common mode voltage.

The small-signal C-V characteristic curve, shown in FIG. 1B, displays an inversion mode of operation region 100 and a depletion mode of operation region 102. An ideal bias point is shown as 104. The ideal bias point 104 can be considered as the reference voltage ($V_{REF}$) 106 that is desired. A threshold voltage of the transistor, $V_T$ 110 dictates the transition voltage between the inversion mode of operation region 100 and the depletion mode of operation region 102. The change in capacitance $\Delta C$ 112 is shown between the inversion mode of operation region 100 and the depletion mode of operation region 102, and corresponds to maximum frequency tunability of the VCO output per varactor.

In conventional systems, the nonlinear C-V behavior of the C-V characteristic curve shown in FIG. 1B, in particular the flatness at control voltages of ground (GND) and VDD, makes the inversion-mode MOS varactor shown in FIG. 1A particularly well suited for PLLs with stringent supply noise rejection requirements for low-jitter operation, such as those utilized in high-speed serial data transmission. Since small variations in control voltages at GND or VDD due to noise have little impact on the small-signal capacitance, the VCO output frequency is weakly modulated and hence contains minimal jitter.

FIG. 2 displays a schematic of a low-jitter, charge-pump phase-locked loop (PLL) implementing a VCO with coarse and fine frequency tuning. For illustrative purposes, the PLL in FIG. 2 consists of a sequential phase-frequency detector driving a charge pump, although other phase detector and loop filter varieties may be used. In this configuration, the PLL synthesizes an output clock whose frequency is N times the input reference clock frequency.

In FIG. 2, a PLL including a sequential phase-frequency detector 200, a loop filter 202, a VCO 204, and a feedback frequency divider (N) 206 are shown. The VCO 204 is driven by coarse control input 210 and a fine control input 208. The coarse control input 210 provides the tuning range necessary for the PLL to lock to its input reference regardless of manufacturing process, supply voltage, and temperature (PVT) fluctuations; uncertainties in circuit modeling during the design process; and the flexibility required to adjust the reference frequency for system test purposes. The coarse control input 210 consists of an array of digital CMOS control voltages at GND or VDD driving a corresponding array of MOS varactors where capacitance is substantially insensitive to control voltage noise due to the flatness of the C-V characteristic near VDD and GND. On the other hand, with its smaller effect on the output of the VCO 204, the fine control input 208 allows the PLL to track small phase perturbations in reference clock input as well as supply voltage and temperature fluctuations during normal operation while providing higher immunity against circuit noise that principally dictate jitter performance. A conventional implementation of a fine control would consist of an analog control voltage driving another array of MOS varactors with an input situated along the inversion-depletion transition of the C-V characteristic.

For certain loop filter implementations, it is necessary to generate a reference voltage for biasing the MOS varactor of FIG. 1 at approximately the "ideal bias point" (shown as 104 of FIG. 1) for maximum analog linearity and symmetric, bi-directional capacitive tuning. In some calibration schemes that establish coarse tuning of the VCO 204, it is also desirable to have the ideal bias point (i.e., 104 of FIG. 1) available as a reference voltage (i.e., $V_{REF}$ 106). However, due to process, voltage, and temperature (PVT) fluctuations that can significantly modulate the threshold voltage $V_T$ 110 of FIG. 1, establishing this "reference voltage" at the ideal bias point across such PVT fluctuations is not trivial. In fact, the threshold voltage $V_T$ 110 (FIG. 1) variations owing to process, voltage, and temperature (PVT) could be so substantial that the resulting $V_{REF}$ 106 (FIG. 1) in some circuits could intersect the varactor C-V characteristic substantially outside the highly sloped inversion-depletion transition, rendering such circuits ineffective for capacitive tuning.

FIG. 3 displays a schematic of a p-channel MOSFET (pFET) voltage divider. A conventional approach for generating $V_{REF}$ is to build a voltage divider using two diode-connected p-channel MOSFETs (pFETs) in series (i.e., each device operating in the saturation region of MOSFET operation) and tapping the intermediate voltage as shown in FIG. 3. In this configuration, each pFET (i.e., $M_{P1}, M_{P2}$) is exhibiting the equivalent behavior of a nonlinear resistor. Hence, the series pFET arrangement is essentially a resistive voltage divider. The use of pFETs is ideal for building a voltage divider whose output voltage is a fixed fraction of VDD. Since commonly available MOS technologies employ p-well substrates, one can enjoy design simplicity in ignoring body effect sensitivities by encasing the pFET whose source node is tied to the output, namely $M_{P2}$, in its own n-well not tied to the supply, but to the source potential of $M_{P2}$. However, this technique is prone to PVT fluctuations in the voltage-dividing elements that are not likely to completely track those in the varactors, especially if the varactors are of the n-channel variety, which is commonly the case.

FIG. 4 displays a schematic of an n-channel MOSFET (nFET) voltage divider that provides another conventional approach for generating $V_{REF}$. In the nFET MOS voltage divider approach, diode-connected n-channel devices (nFETs) are used in place of a pFET voltage divider of FIG. 3. Although the designer has the added complexity of sizing the devices to account for the body effect on the nFET tied to VDD, namely $M_{N1}$, this approach provides some limited tracking of process variations since ion implants are common to the manufacture of both voltage divider and varactor nFETs. In other words, the nFETs ($M_{N1}$, $M_{N2}$) used for generating $V_{REF}$ have the same $V_T$ characteristic and PVT sensitivities as the nFETs configured as varactors. This approach, however, has the drawback of exhibiting $V_{REF}$ variations due to the variation in bias currents flowing through both transistors across PVT.

In each of the two foregoing circuit configurations, there is an attempt to build a VCO reference voltage generator (i.e., FIG. 2, FIG. 3) that works across manufacturing process, voltage, and temperature (PVT) tolerances. In a scenario with PVT variations, the threshold voltage is going to drift, and if the drift of the voltage threshold is not tracked, each of the foregoing VCO circuits will be biased at a point that is closer to inversion or closer to depletion instead of at the ideal bias point. When the VCO circuit is biased closer to inversion and/or depletion, the tuning range of the VCO is diminished and the robustness of the VCO is degraded.

Thus, there is a need for a VCO reference voltage generator that works consistently and substantially independent of process, voltage, and temperature (PVT) variations. There is a need for a VCO reference voltage generator that can tolerate PVT variations with minimal voltage drifting and still retain maximum capacitive tuning of the VCO.

SUMMARY OF THE INVENTION

In accordance with the teachings of the present invention, a circuit design is presented that generates a reference voltage that tracks fluctuations in a threshold voltage ($V_T$) due to PVT fluctuations. In one embodiment, a technique is presented that provides a reference voltage that biases a MOS varactor very near its "ideal bias point" across PVT variations.

In one embodiment, a silicon integrated circuit (IC) technique is presented that produces a reference voltage for biasing a metal-oxide-semiconductor (MOS) transistor used as a varactor for capacitive tuning applications. The reference voltage is designed to bias the varactor to the center of its nonlinear capacitance-voltage transition from inversion mode to depletion mode of operation, thereby providing maximum linearity and range of bi-directional capacitive tuning. A substantial advantage of this circuit technique is its ability to track the varactor's threshold voltage dictating the inversion-depletion transition voltage and hence provide optimum biasing across threshold voltage variations owing to manufacturing process, supply voltage, and temperature (PVT) variations. In addition, the circuit technique exploits the availability of transistors with multiple threshold voltages in deep-submicron complementary MOS (CMOS) technologies.

A circuit comprises a diode-clamped FET; an element coupled to the FET at a connection point and producing a constant current through the FET; an output coupled to the connection point, the output generating a voltage; and a varactor coupled to the output and operating in response to the voltage.

A method of operating a variable-controlled oscillator (VCO) comprises the steps of operating a biasing circuit, the biasing circuit comprising a diode-clamped FET, an element coupled to the diode-clamped FET at a connection point, the element producing a constant current through the diode-clamped FET, an output coupled to the connection point; establishing a voltage that is one gate overdrive ($V_{GS}-V_T$) plus a threshold voltage above ground in response to operating the biasing circuit; and tracking an ideal voltage in a varactor coupled to the biasing circuit in response to establishing the voltage.

A method of biasing a varactor comprises the steps of operating a circuit that generates an output voltage that is one $V_T$ below VDD; and tracking a threshold voltage in the varactor in response to operating the circuit that generates an output voltage that is one $V_T$ below VDD.

A circuit comprises a diode-clamped FET; an element coupled to the diode-clamped FET at a connection point and producing a constant current through the diode-clamped FET; an output coupled to the connection point, the output generating a voltage; and a varactor coupled to the output and operating in response to the voltage.

A method of operating a variable-controlled oscillator, comprises the steps of operating a biasing circuit, the biasing circuit comprising a diode-clamped FET, an element coupled to the diode-clamped FET at a connection point, the element producing a constant current through the diode-clamped FET, an output coupled to the connection point; establishing a voltage that is one gate overdrive plus a threshold voltage above ground in response to operating the biasing circuit; and tracking an ideal voltage in a varactor coupled to the biasing circuit in response to establishing the voltage.

A method of biasing a varactor, comprises the steps of operating a circuit that generates an output voltage that is one $V_T$ below VDD; and tracking a threshold voltage in the varactor in response to operating the circuit that generates an output voltage that is one $V_T$ below VDD.

DETAILED DESCRIPTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 5:
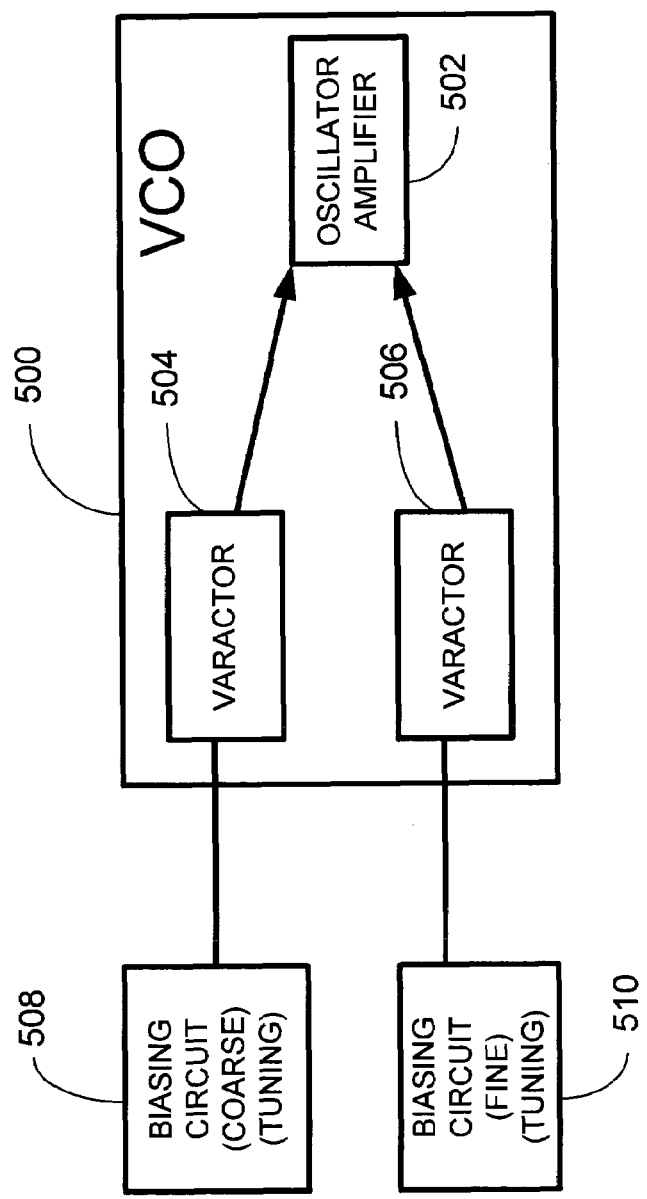
FIG. 5 displays a block diagram of one embodiment of the present invention in which a variable-controlled oscillator is tuned using biasing circuits.

FIG. 5 displays a block diagram of one embodiment of the present invention in which a voltage-controlled oscillator is tuned using biasing circuits. A voltage-controlled oscillator (VCO) is shown as 500. The voltage-controlled oscillator (VCO) includes two voltage-tunable variable capacitors (i.e., varactors 504 and 506). Each varactor (504, 506) is biased using a biasing circuit. Varactor 504 is controlled by a biasing circuit 508, which is used for coarse tuning, and varactor 506 is controlled with a biasing circuit 510, which is used for fine-tuning. In accordance with the teachings of the present invention, biasing circuit 508 and biasing circuit 510 are implemented to set the varactors 504 and 506 at the ideal bias point and allow for maximum tuning of the varactors 504 and 506, the oscillator amplifier 502, and the VCO 500.

Figure 6:
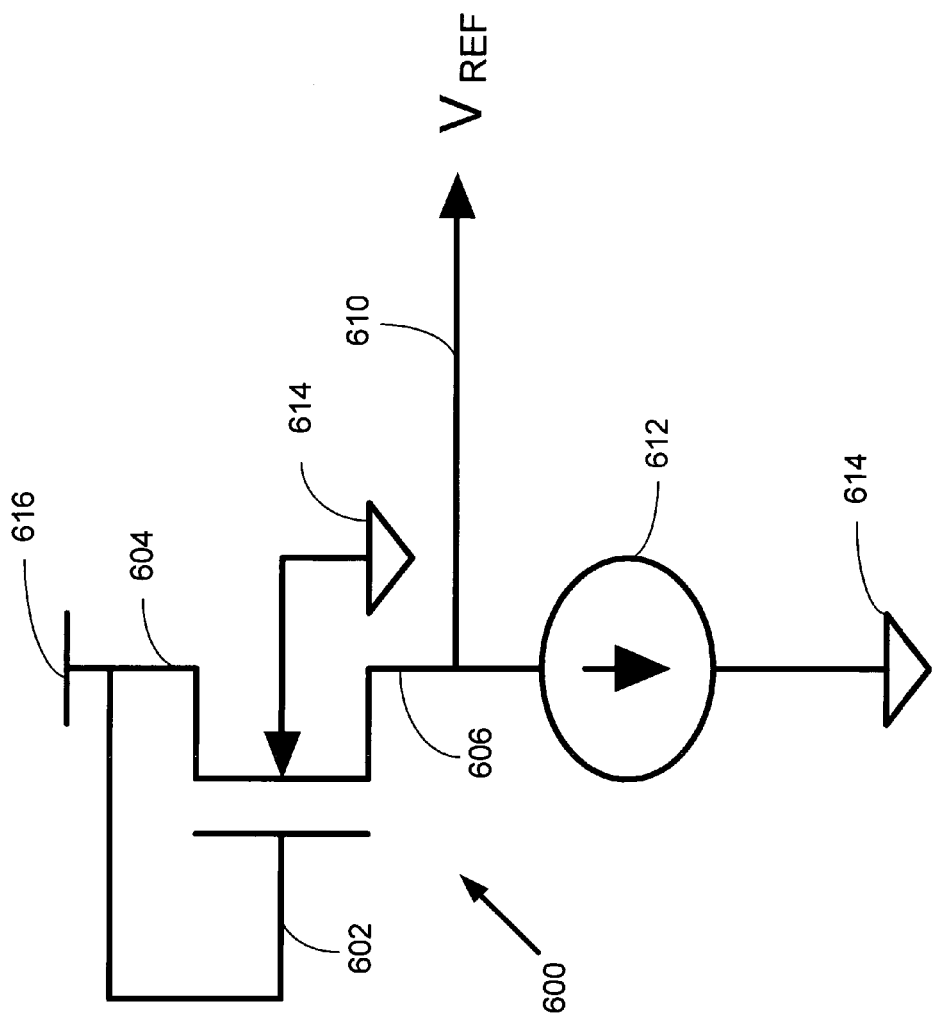
FIG. 6 displays a schematic of one embodiment of a biasing circuit implemented with a current source pulling constant current through diode-clamped nFET.

FIG. 6 displays a schematic of one embodiment of a biasing circuit implemented with a current source pulling constant current through diode-clamped nFET. A diode-clamped nFET is defined as an nFET in which the gate and the drain are shorted together. The diode-clamped nFET 600 is shown in which the gate 602 and the drain 604 are both shorted to VDD 616. The source 606 is tied to an output voltage Vref 610. A constant current source 612 is connected between the source 606 and ground 614.

Figure 1:
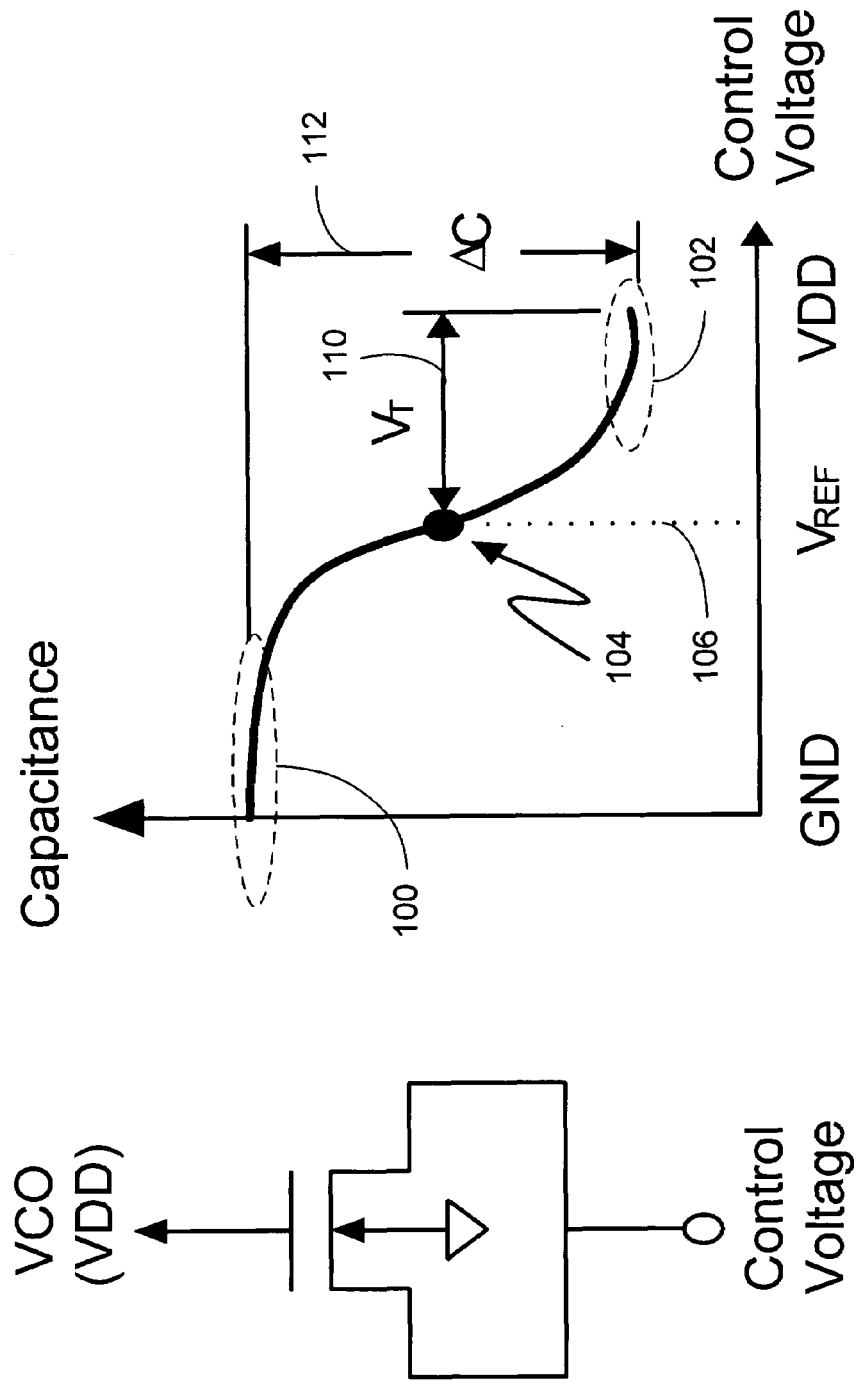
FIG. 1A displays an n-channel MOS varactor.
FIG. 1B displays the capacitance-voltage (C-V) characteristic curve for the n-channel MOS varactor shown in FIG. 1A.
Figure 2:
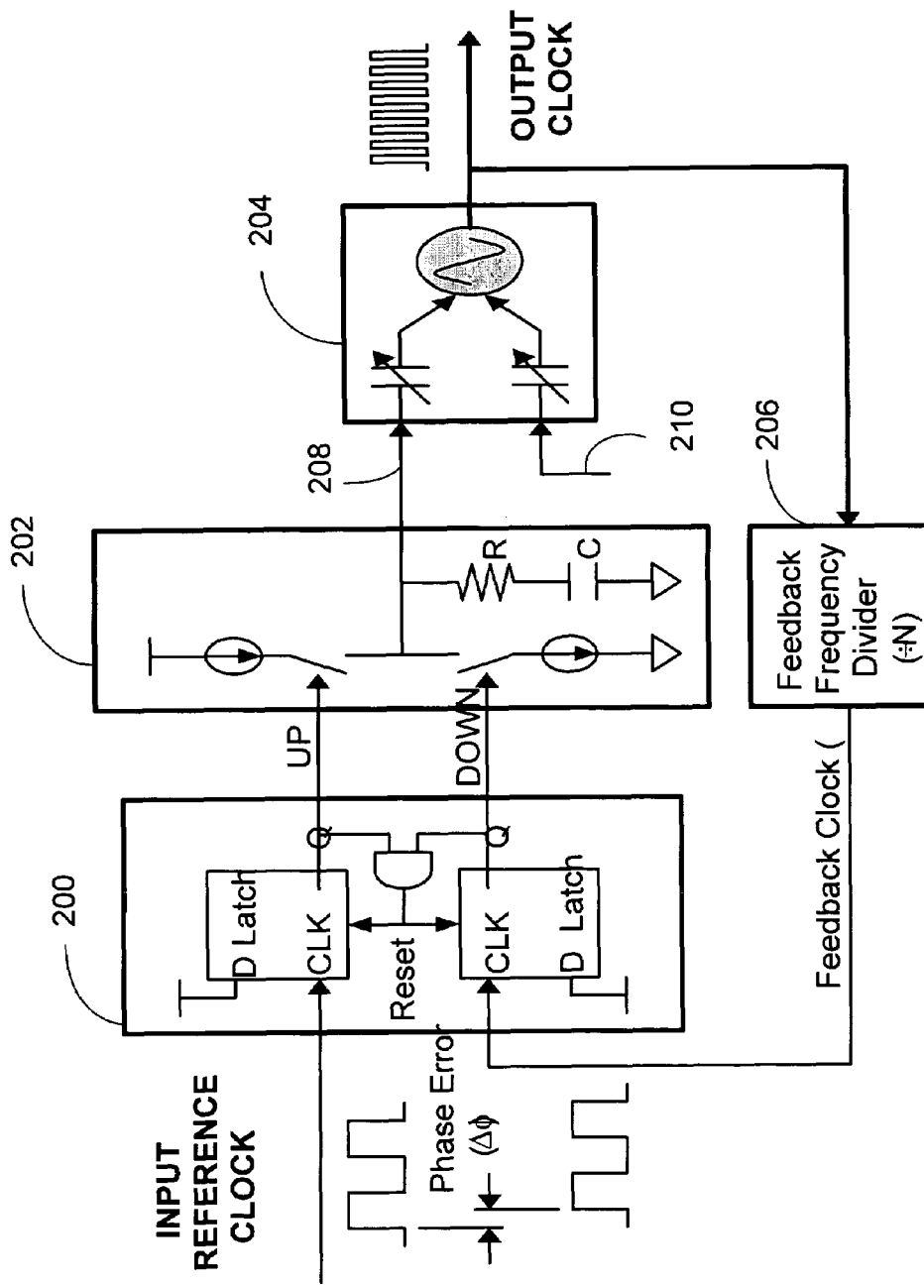
FIG. 2 displays a schematic of low-jitter, charge-pump phase-lock loop (PLL) implementing a VCO with coarse and fine frequency tuning.
Figure 3:
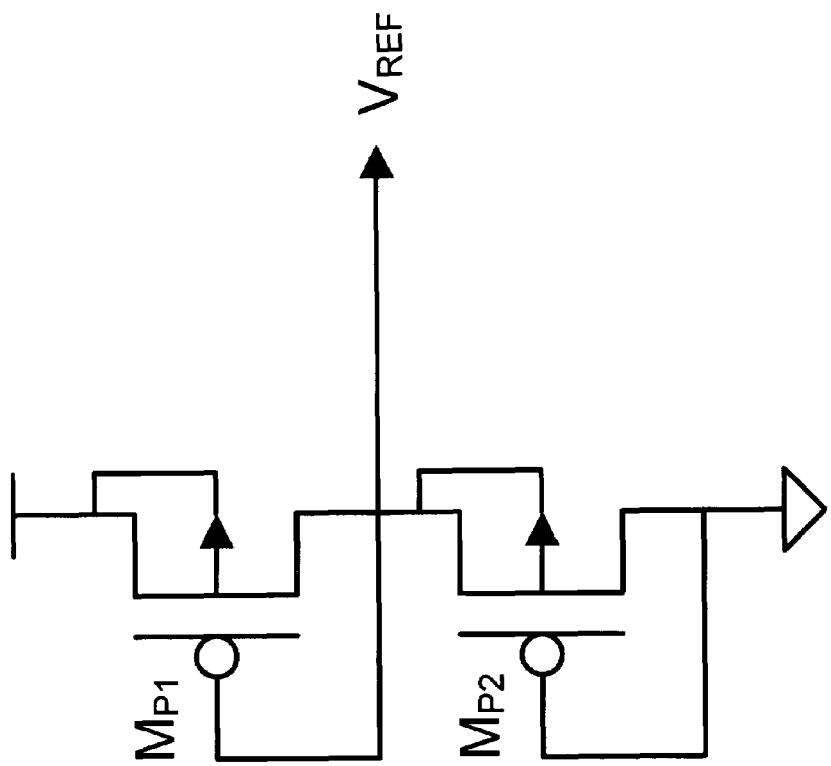
FIG. 3 displays a schematic of a pFET voltage divider.
Figure 4:
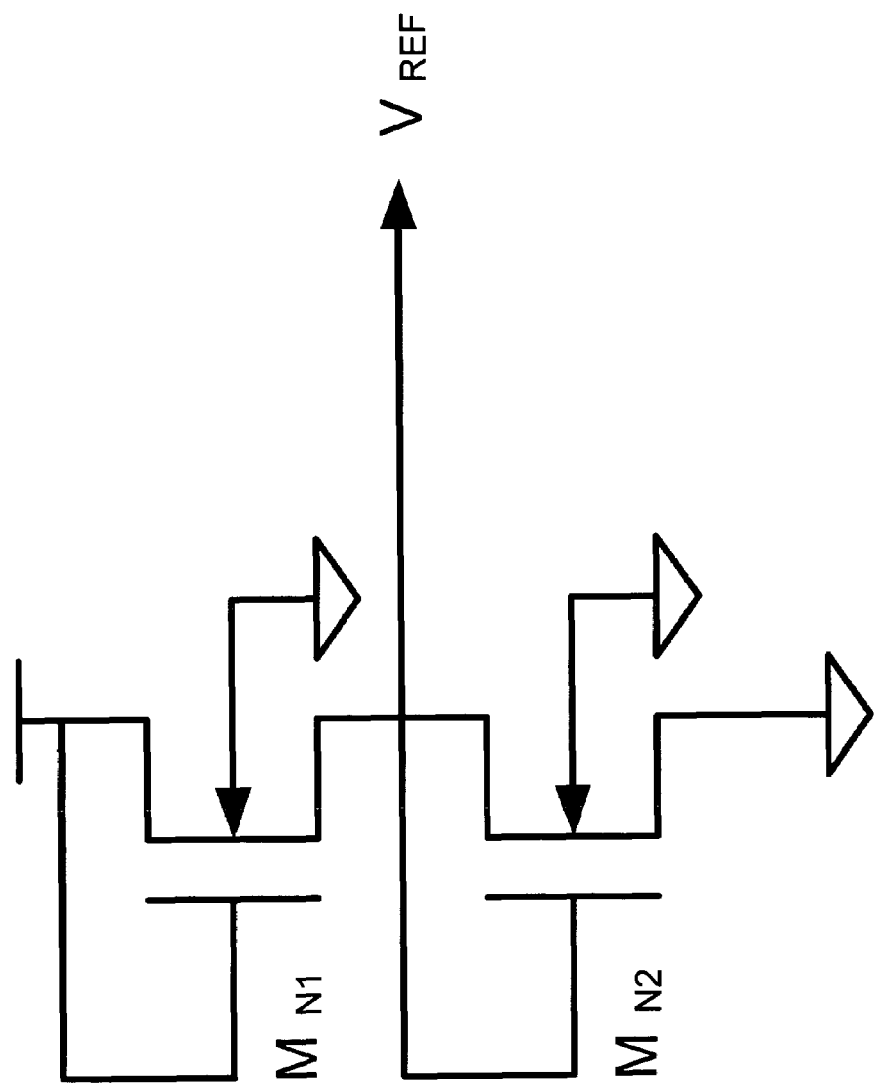
FIG. 4 displays a schematic of an nFET voltage divider.

The biasing circuit depicted in FIG. 6 is designed to produce a voltage ($V_{REF}$) 610 that is at least $V_T$ below VDD 616. As a result, the biasing circuit depicted in FIG. 6 will automatically track the ideal bias point across $V_T$. By pulling a constant current through diode-clamped nFET 600, the resulting voltage $V_{REF}$ 610 is forced to be one threshold voltage ($V_T$) plus some gate overdrive ($V_{GS}-V_T$) below VDD 616. This can be seen by considering the drain current of a long-channel nFET operating in saturation:

$$I_D = \tfrac{1}{2} \ast \mu_n C_{ox} \ast (W/L)(V_{GS}-V_T)^2$$

where $\mu_n$=electron mobility, $C_{ox}$=gate oxide capacitance per unit area, W=device width, L=device length, and $V_{GS}$=VDD$-V_{REF}$=gate-to-source voltage. If the diode-clamped nFET 600 is sized sufficiently large, i.e., large W/L ratio, such that the gate overdrive ($V_{GS}-V_T$) is small, then:

$$VGS = VDD - V_{REF} \approx V_T$$

or equivalently, $$V_{REF} \approx VDD - V_T$$

which is precisely the desired "ideal bias point" that is illustrated in FIG. 1. The body effect is a noted condition in which the voltage of the substrate in the FET modulates the threshold voltage of the FET. The biasing circuit of FIG. 6 produces a $V_T$ that takes into account the body effect and is higher than the zero-body-bias $V_T$ since the source 606 is tied to $V_{REF}$. The magnitude of $V_T$ increase due to the body effect is described by:

$$V_T = V_{T0} + \gamma \ast [(2\phi + V_{REF})^{1/2} - (2\phi)^{1/2}]$$

where $V_{T0}$=zero-body-bias threshold voltage, $\gamma$=body effect coefficient, and $\phi$=strong inversion surface potential. In other words, this biasing circuit also tracks process variations leading to body effect sensitivities.

In some applications where the high output resistance of the current source cannot be tolerated, the device(s) comprising the current source may be sized towards longer channel lengths where short-channel effects degrade output resistance to lower values.

Figure 7B:
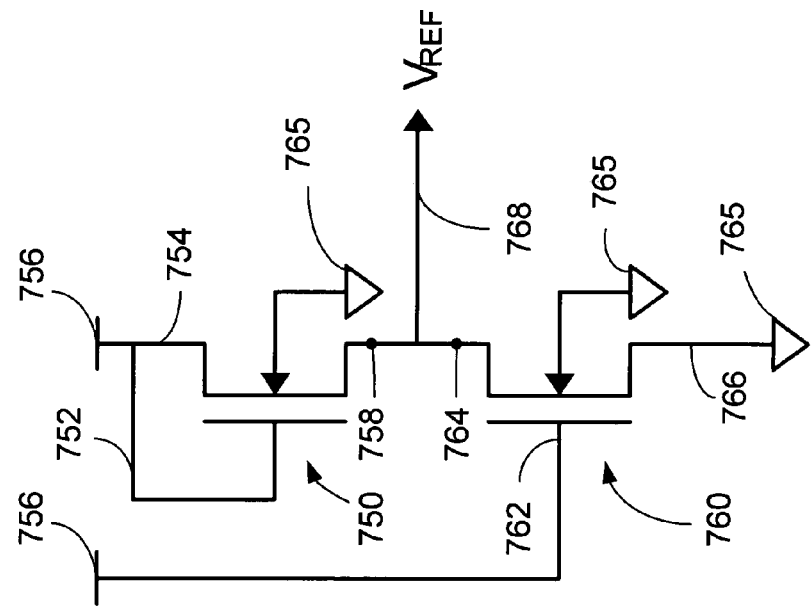
FIG. 7B displays a schematic of one embodiment of a biasing circuit implemented with diode-clamped nFET ($M_{N1}$) connected to an active resistor load.
Figure 7A:
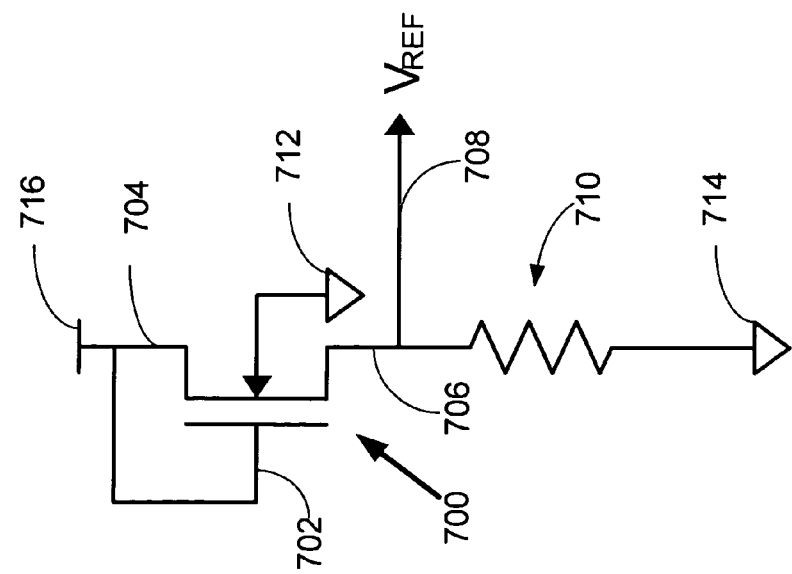
FIG. 7A displays a schematic of one embodiment of a biasing circuit implemented with diode-clamped nFET connected to a passive resistor load.

FIG. 7A displays a schematic of one embodiment of a biasing circuit implemented with diode-clamped nFET connected to a passive resistor load. An nFET 700 is shown in which the gate 702 and the drain 704 are both shorted to VDD 716. The source 706 is tied to an output voltage $V_{REF}$ 708. A resistor 710 is connected between the source 706 and ground 714.

FIG. 7B displays a schematic of one embodiment of a biasing circuit implemented with diode-clamped nFET connected to an active resistor load 760. In FIG. 7B, nFET 750 is shown in which the gate 752 and the drain 754 are both shorted to VDD 756. The source 758 is tied to an output voltage $V_{REF}$ 768. An active resistor load 760 is connected between the source 758, ground 765, and VDD 756. The active resistor load 760 includes a gate 762 tied to VDD 756. The drain 764 is tied to the source 758 and voltage $V_{REF}$ 768. The source 766 is tied to ground 765. In one embodiment, the biasing circuit depicted in FIG. 7B may be implemented in a monolithic IC implementation. In this case, the active transistor load 760 is biased into the triode region of operation. The penalty for a lower pull-down resistance is greater variation in ($V_{GS}-V_T$) across nFET 750 since the current through nFET 750 now depends on resistance variations.

Deep submicron complementary MOS (CMOS) technologies now offer nFETs and pFETs with a selectable variety of $V_T$s in order to circumvent the compromise between device off-state leakage and on-state drive strength. For example, designers can now employ high-$V_T$ devices where leakage current is a disadvantage and low-$V_T$ devices where drive strength is a bigger need.

In one embodiment, multiple $V_T$ devices are exploited to mitigate the drawback of small gate overdrive by implementing a MOS varactor using a lower $V_T$ device to bias a MOS varactor implemented using higher $V_T$ devices. Analog circuits with small gate overdrive are typically less immune to noise. The difference between $V_T$s now provides additional gate overdrive in nFET 600. This embodiment is illustrated in FIG. 8.

Figure 8:
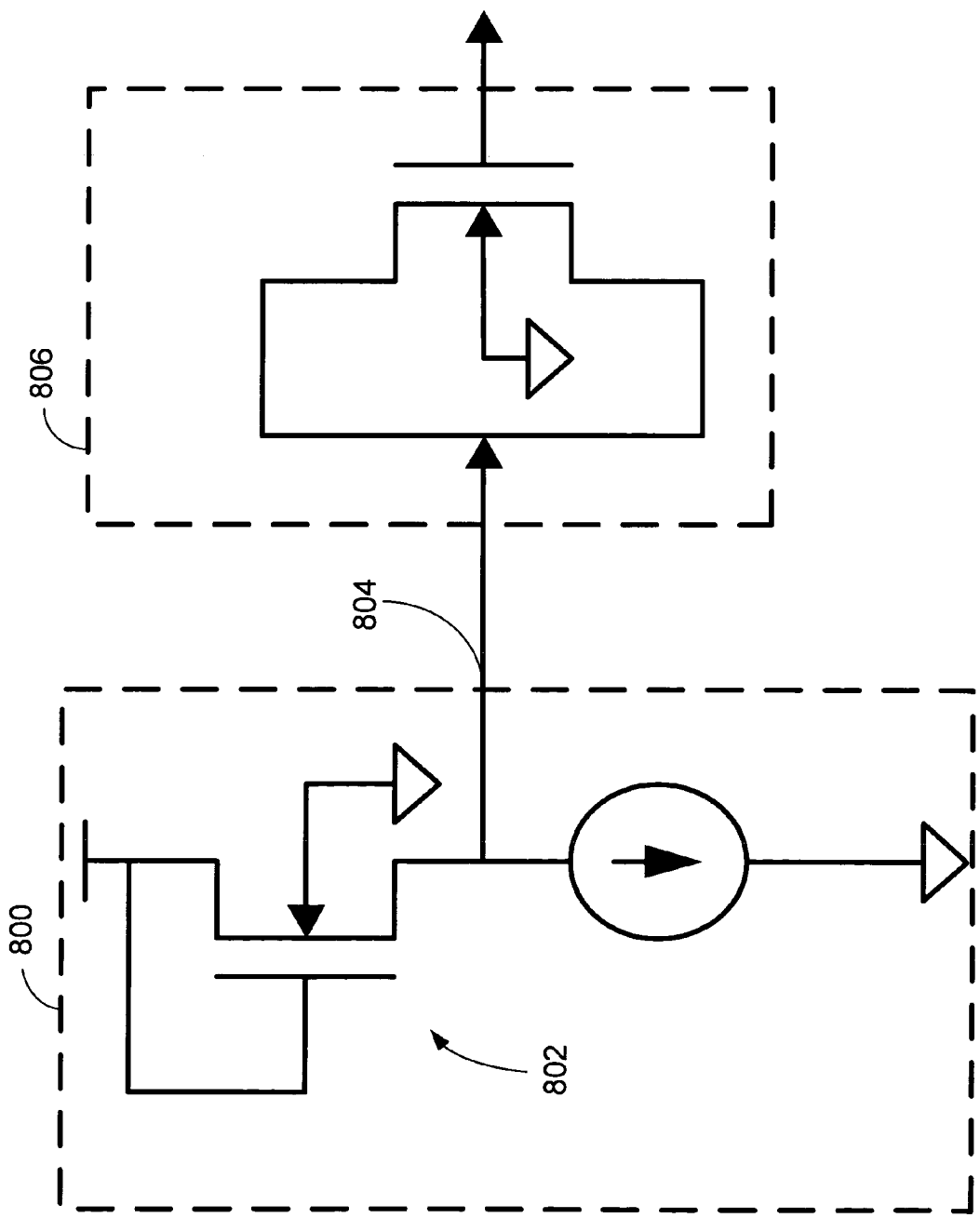
FIG. 8 displays a schematic of one embodiment a biasing circuit implemented with a current source pulling constant current through diode-clamped, nominal-$V_T$ nFET ($M_{N1}$) to bias high-$V_T$ MOS varactor.

FIG. 8 displays the schematic of one embodiment of the present invention with a current source pulling constant current through diode-clamped, nominal-$V_T$ nFET 800 to bias high-$V_T$ MOS varactors 806. In FIG. 8, the FET that is establishing $V_{REF}$ 804 is an nFET 802 where the gate and the drain are shorted to VDD. The source is tied to the output voltage $V_{REF}$. The current that biases the FET is established by a current source pulling current from $V_{REF}$ to ground. The output $V_{REF}$ 804 is driving a varactor 806. In one embodiment, the varactor 806 is an inversion mode MOS varactor where the source and drain are shorted together.

Figure 9:
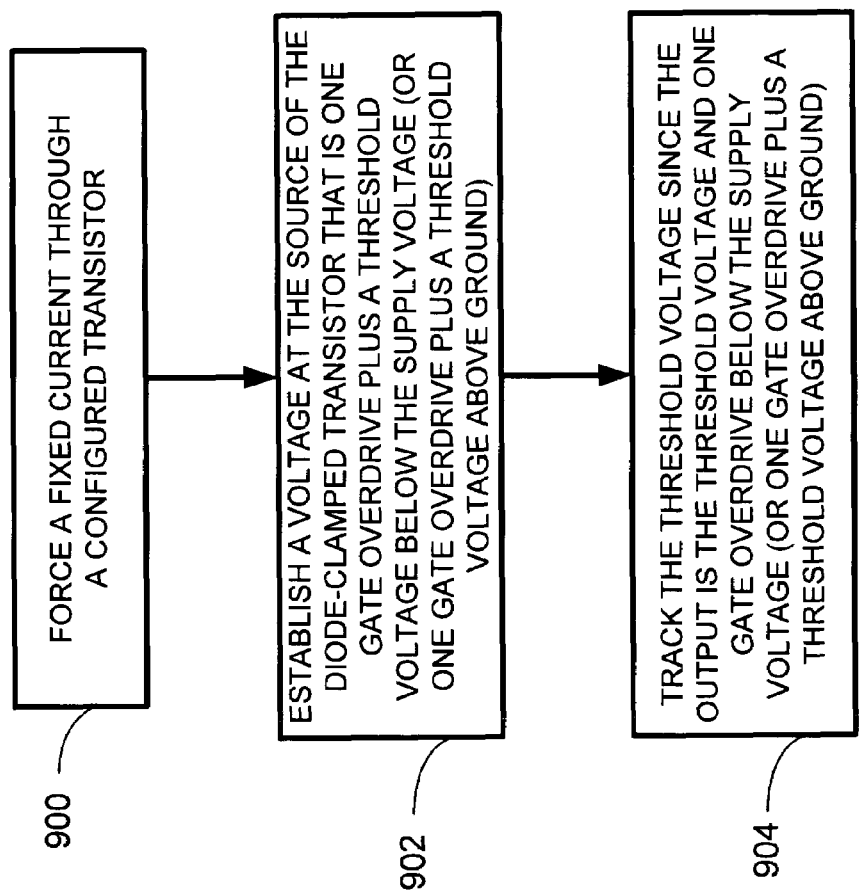
FIG. 9 displays a flow diagram depicting the operation of the configuration (i.e., current source pulling constant current through diode-clamped, nominal-$V_T$ nFET to bias high-$V_T$ MOS varactor) shown in FIG. 8.

FIG. 9 displays a flow diagram depicting the operation of the configuration (i.e., current source pulling constant current through diode-clamped, nominal-$V_T$ nFET to bias high-$V_T$ MOS varactor) shown in FIG. 8. FIG. 9 will be described in conjunction with FIG. 8. At 900, a fixed current is forced through a diode-clamped transistor. In FIG. 8, a fixed current is forced through the diode-clamped transistor 802 by implementing the fixed current source. In addition, it should be appreciated that in the configurations shown as FIG. 7A and FIG. 7B, the resistor 710 and the nFET 760 perform the same function as the current source for the nFET 802. At 902, a voltage is established at the source of the diode-clamped transistor shown in FIG. 8. A voltage (i.e., $V_{REF}$) is one gate overdrive plus a threshold voltage below the supply voltage (or one gate overdrive plus a threshold voltage above ground in the case of a pFET implementation) (see FIGS. 11, 12, 13, and 14).

At 904, using the configuration of FIG. 8, $V_{REF}$ is established such that $V_{REF}$ will track the threshold voltage since the output (i.e., $V_{REF}$) is the threshold voltage and one gate overdrive below the supply voltage (or one gate overdrive plus a threshold voltage above ground in the case of a pFET implementation) (see FIGS. 11, 12, 13, and 14). To most effectively track second-order effects on $V_T$ such as $V_T$ variations due to channel length, channel width, active area mechanical stress, lithography/etch loading, and well mask proximity, $M_{N1}$ can be sized to be a replica or arrayed replica of the MOS varactor to be biased. For example, using FIG. 8, the nFET 802 may be sized to be a replica or arrayed replica of the MOS varactor 806. In addition, the biasing circuit devices may be positioned in similar environments (i.e., located in proximity) to optimize transistor matching of the varactor FETs against aforementioned second order effects. Minimized physical differences between 802 and 806 results in consistent capacitive tuning capability.

Figure 10:
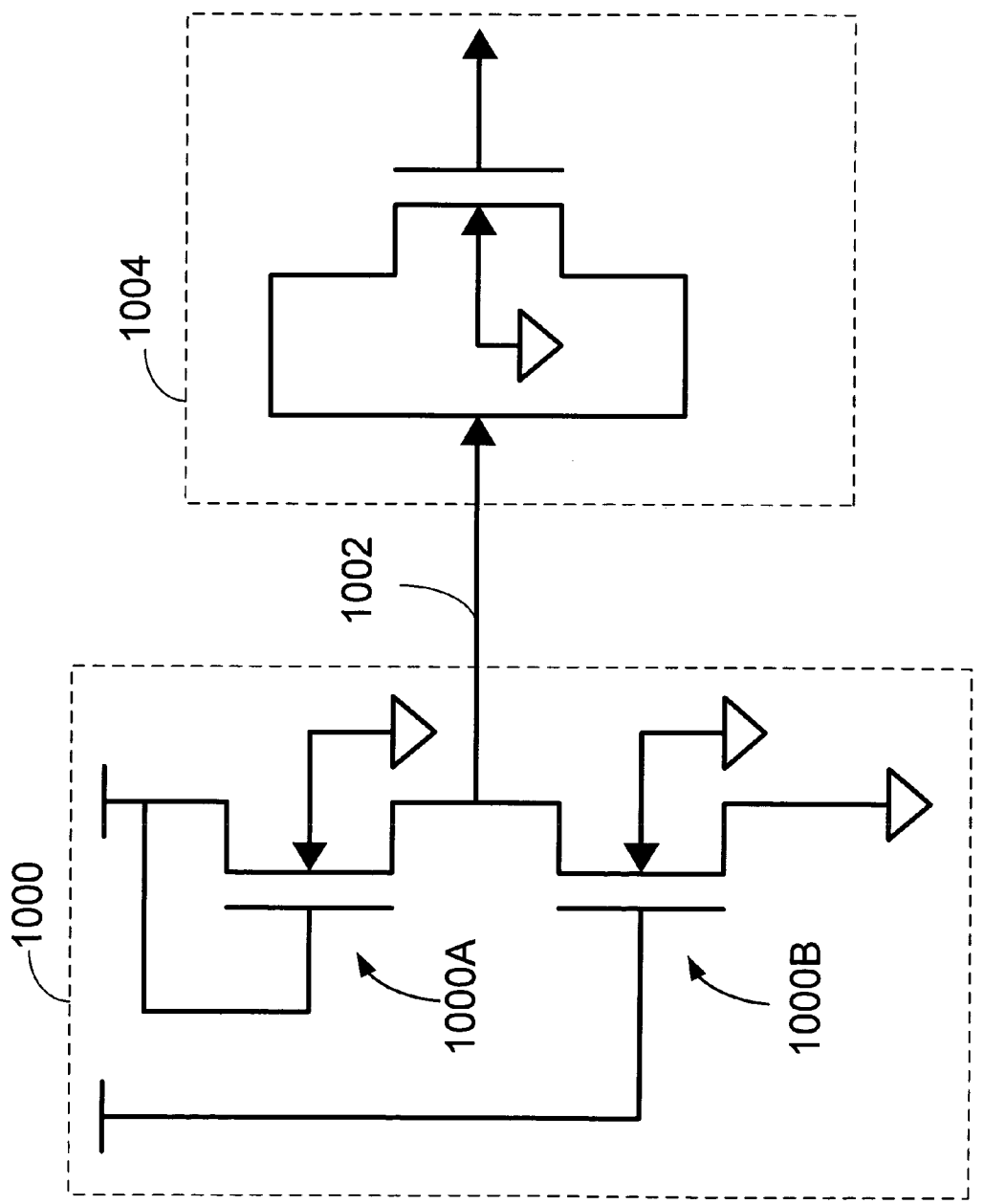
FIG. 10 displays a schematic of an embodiment of a design implementation of the present invention.

FIG. 10 displays a schematic of an embodiment of a design implementation of the present invention. The design example is presented to demonstrate the effectiveness of the proposed invention. In FIG. 10, a biasing circuit 1000 that generates a voltage reference 1002 to drive a varactor 1004. In one embodiment, the biasing circuit 1000 includes two nominal-$V_T$ nFETs 1000A and 1000B. Both nominal-$V_T$ nFETs 1000A and 1000B are implemented with $V_{T0}$s of 0.28V and operate at a 1.0V supply voltage. Nominal-$V_T$ nFETs 1000A were implemented with sixteen 0.80 µm/0.56 µm devices in parallel. Nominal-$V_T$ nFETs 1000B were implemented with sixteen 0.60 µm/1.00 µm devices in parallel. Varactor 1004 is implemented with high-$V_T$ devices having $V_{T0}$s of 0.34V for 1.0V supply operation. As seen in FIG. 10, the biasing circuit 1000 was selected to generate voltage $V_{REF}$ 1002 for nFET varactor 1004 with W/L=0.80 µm/0.56 µm.

Figure 11:
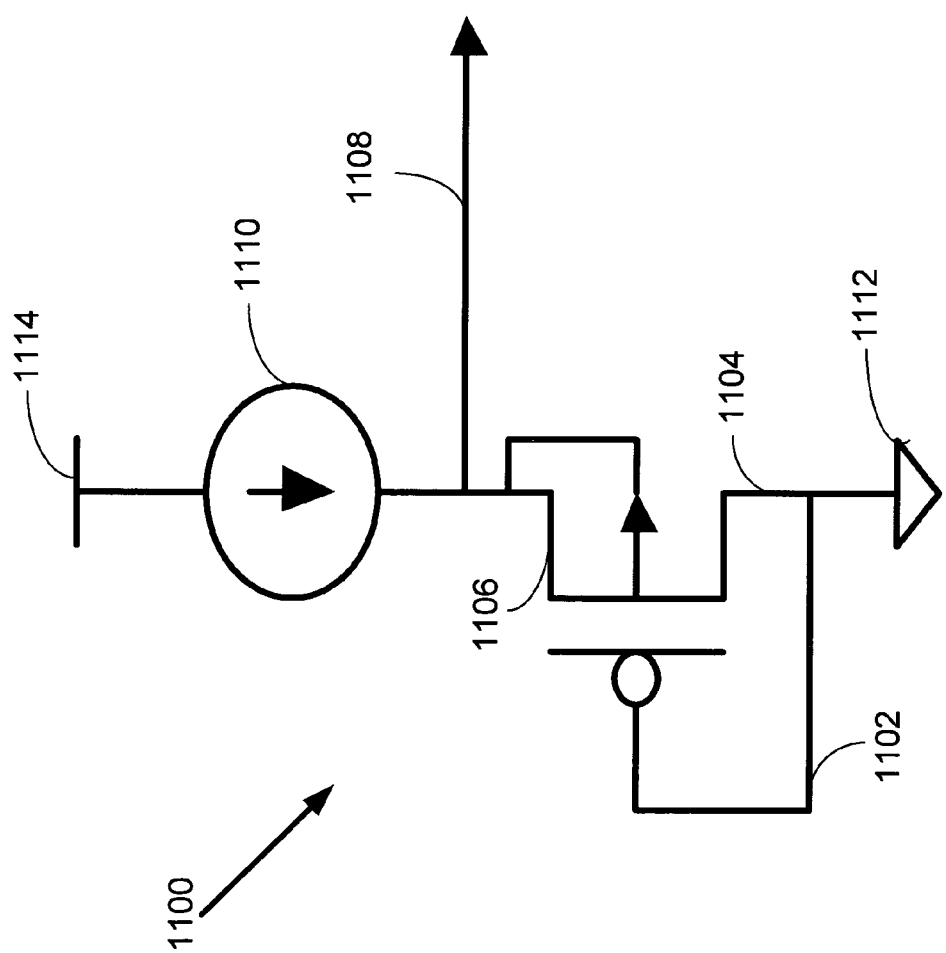
FIG. 11 displays a schematic of one embodiment of a biasing circuit implemented with a current source pushing constant current through diode-clamped pFET.

FIG. 11 displays a schematic of one embodiment of the present invention implemented with a current source pushing constant current through a diode-clamped pFET. FIG. 11 is a pFET implementation of the biasing circuit shown in FIG. 6 and thus operates in a comparable manner. A diode-clamped pFET is defined as a pFET in which the gate and the drain are shorted together. The diode-clamped pFET 1100 is shown in which the gate 1102 and the drain 1104 are both shorted to ground 1112. The source 1106 is tied to an output voltage $V_{REF}$ 1108. A constant current source 1110 is connected between VDD 1114 and the source 1106.

Figure 12:
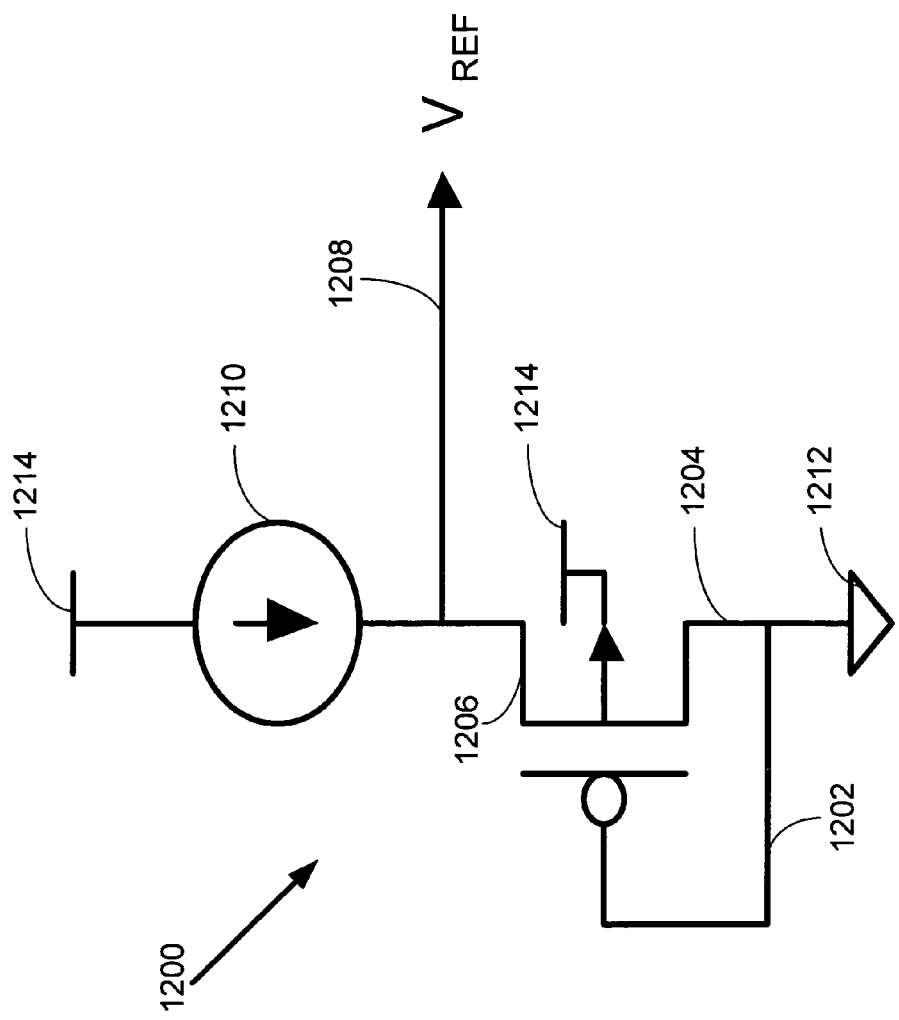
FIG. 12 displays a schematic of a second embodiment of a biasing circuit implemented with a current source pushing constant current through diode-clamped pFET.
Figure 13:
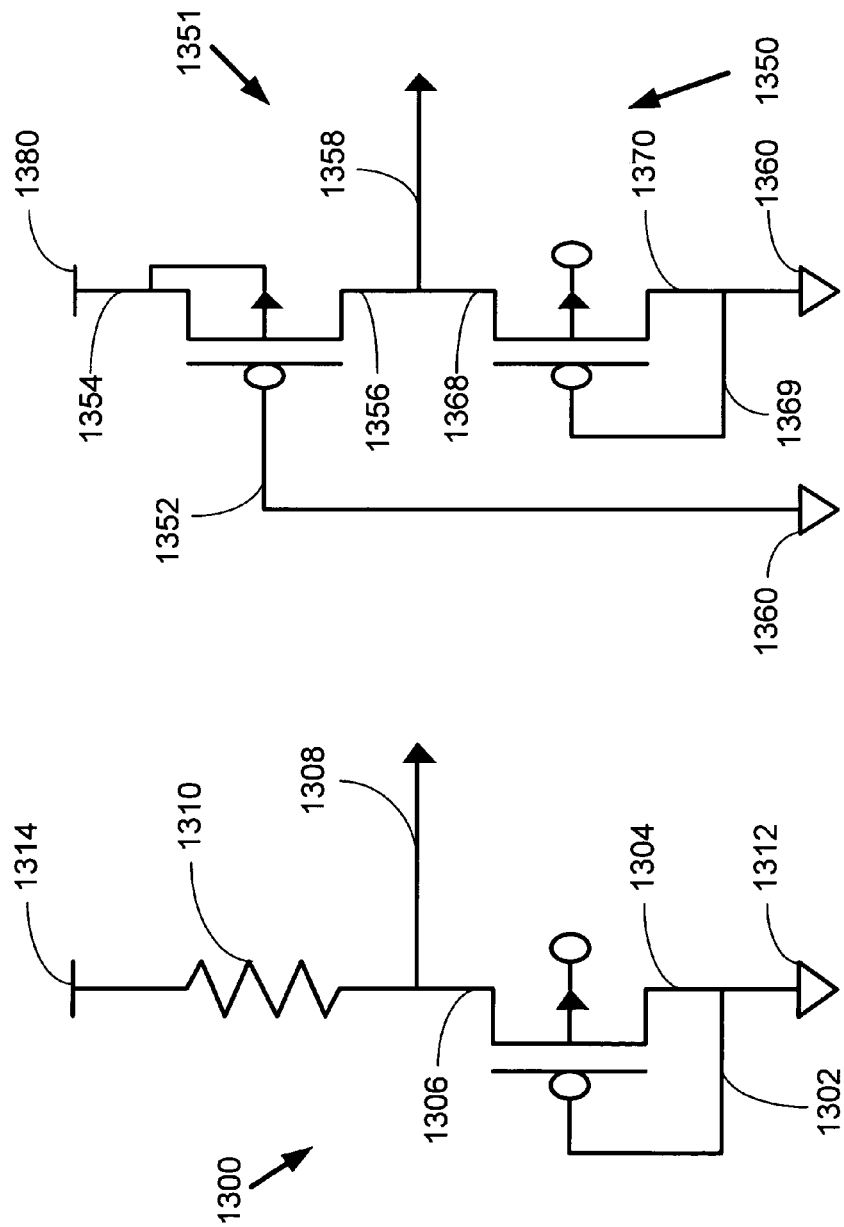
FIG. 13A displays a schematic of one embodiment of a biasing circuit implemented with diode-clamped pFET connected to a passive resistor load.
FIG. 13B displays a schematic of one embodiment of a biasing circuit implemented with diode-clamped pFET connected to an active resistor load.

FIG. 12 displays a schematic of a second embodiment of the present invention implemented with a current source pushing constant current through diode-clamped pFET. FIG. 12 is a second pFET implementation of the biasing circuit shown in FIG. 6 and thus operates in a comparable manner. A diode-clamped pFET is defined as a pFET in which the gate and the drain are shorted together. The diode-clamped pFET 1200 is shown in which the gate 1202 and the drain 1204 are both shorted to ground 1212. The source 1206 is tied to an output voltage $V_{REF}$ 1208. A constant current source 1210 is connected between VDD 1214 and the source 1206.

FIG. 13A displays a schematic of one embodiment of the present invention implemented with diode-clamped pFET connected to a passive resistor load. In FIG. 13A, a pFET 1300 is shown in which the gate 1302 and the drain 1304 are both shorted to ground 1312. The source 1306 is tied to an output voltage $V_{REF}$ 1308. A resistor 1310 is connected between the source 1306 and VDD 1314.

FIG. 13B displays a schematic of one embodiment of the present invention implemented with diode-clamped pFET connected to an active resistor load. In FIG. 13B, pFET 1350 is shown in which the gate 1369 and the drain 1370 are both shorted to ground 1360. The source 1368 is tied to an output voltage $V_{REF}$ 1358. An active resistor load 1351 is connected between the source 1368, ground 1360, and VDD 1380. The active resistor load 1351 includes a gate 1352 tied to ground 1360. The drain 1356 is tied to the source 1368 and voltage $V_{REF}$ 1358. The source 1354 is tied to VDD 1380. In one embodiment, the circuit depicted in FIG. 13B may be implemented in a monolithic IC implementation. In this case, the active transistor load 1351 is biased into the triode region of operation.

Figure 14:
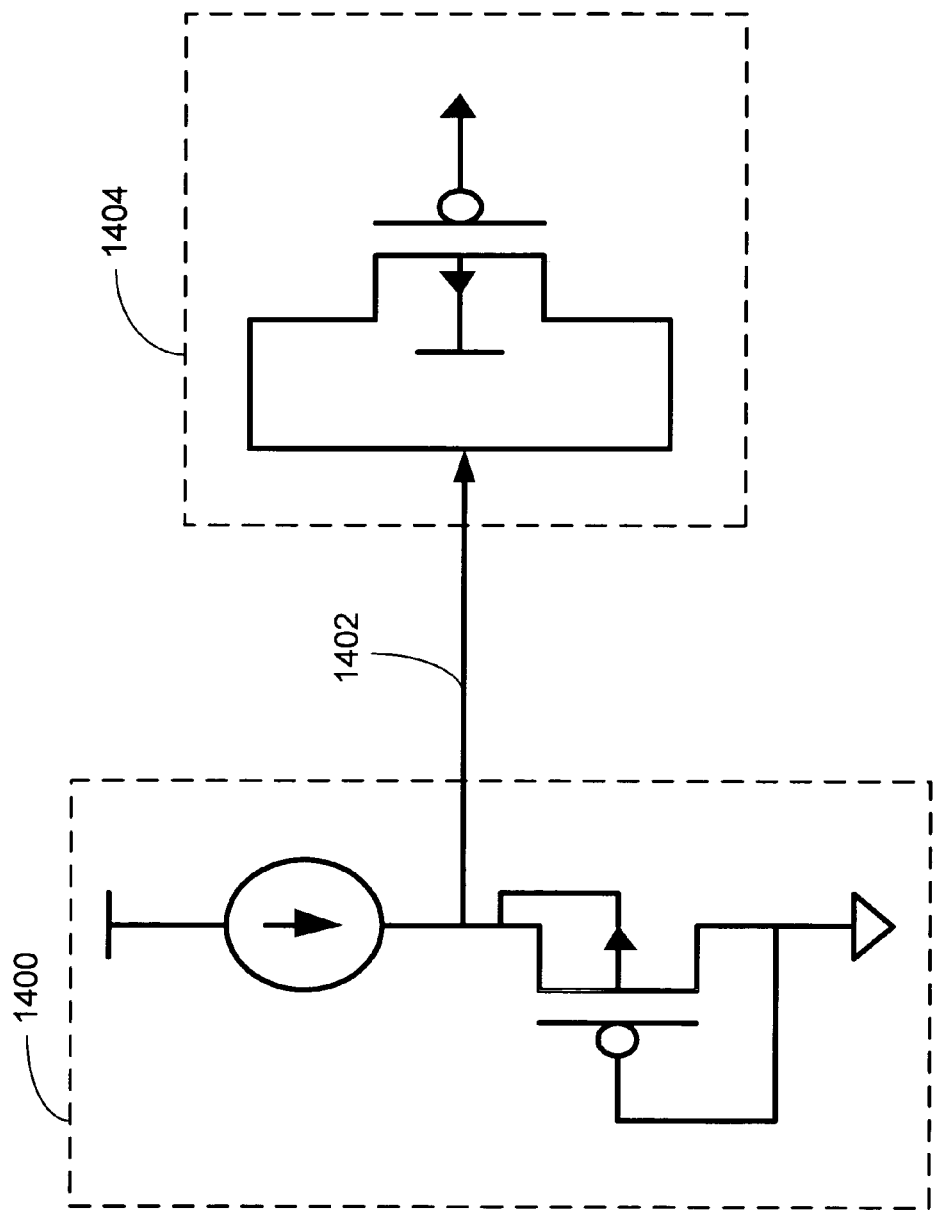
FIG. 14 displays a schematic of one embodiment of the present invention with current source pushing constant current through diode-clamped nominal-$V_T$ pFET to bias high-$V_T$ MOS varactor.

FIG. 14 displays a schematic of one embodiment of the present invention with a current source pushing constant current through diode-clamped nominal-$V_T$ pFET to bias high-$V_T$ MOS varactors. In FIG. 14, the biasing circuit 1400 that is establishing voltage $V_{REF}$ 1402 is a pFET where the gate and the drain are shorted to ground and the source is tied to the output voltage $V_{REF}$ 1402. The current that biases the pFET is established by a current source pushing current from VDD to voltage $V_{REF}$ 1402. The output voltage $V_{REF}$ 1402 is driving a varactor 1404. In one embodiment, the varactor 1404 is an inversion mode MOS varactor where the source and drain are shorted together.

Figure 15A:
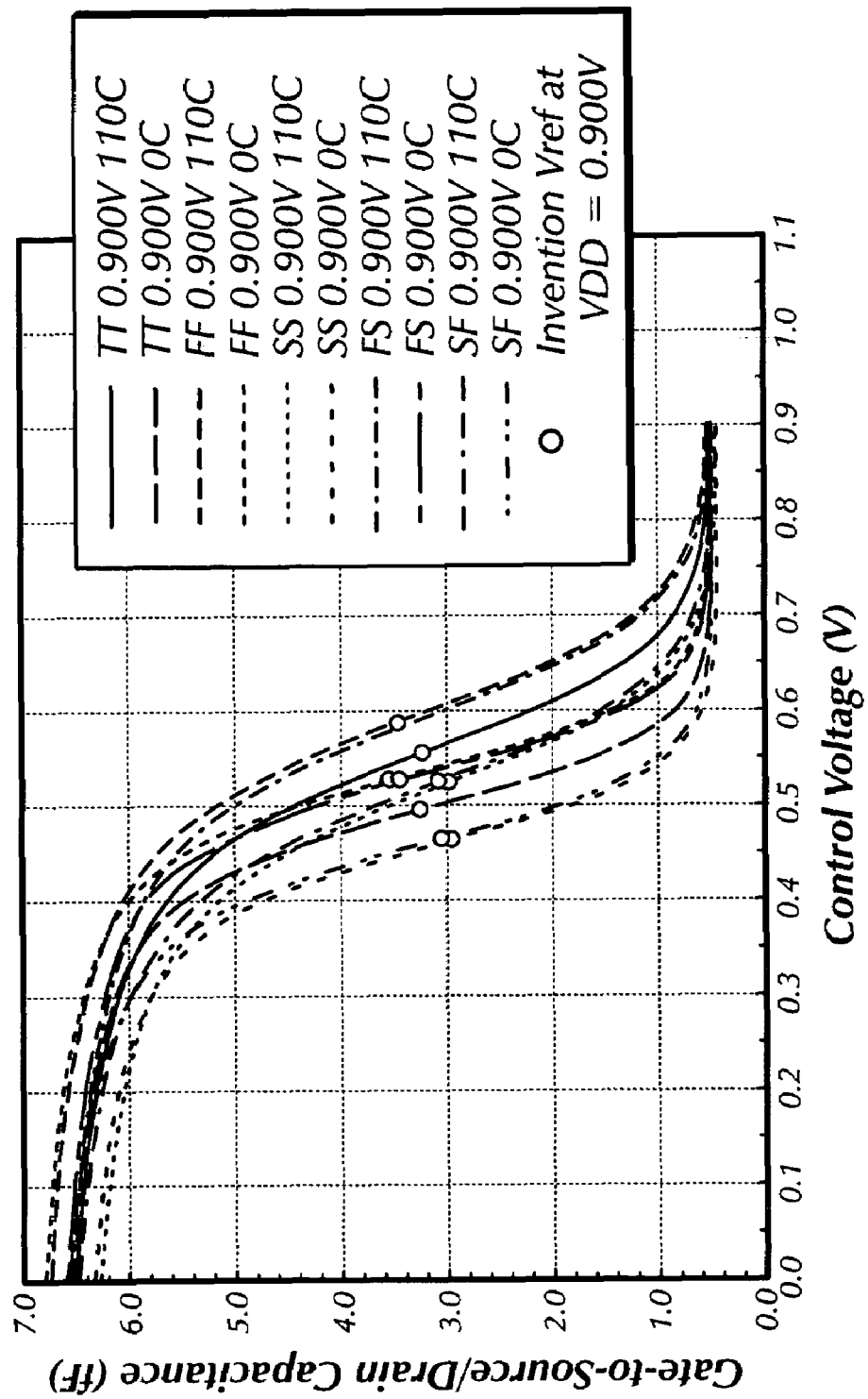
FIG. 15A displays simulation results of design examples of proposed invention at supply voltage VDD of 0.900V.
Figure 15B:
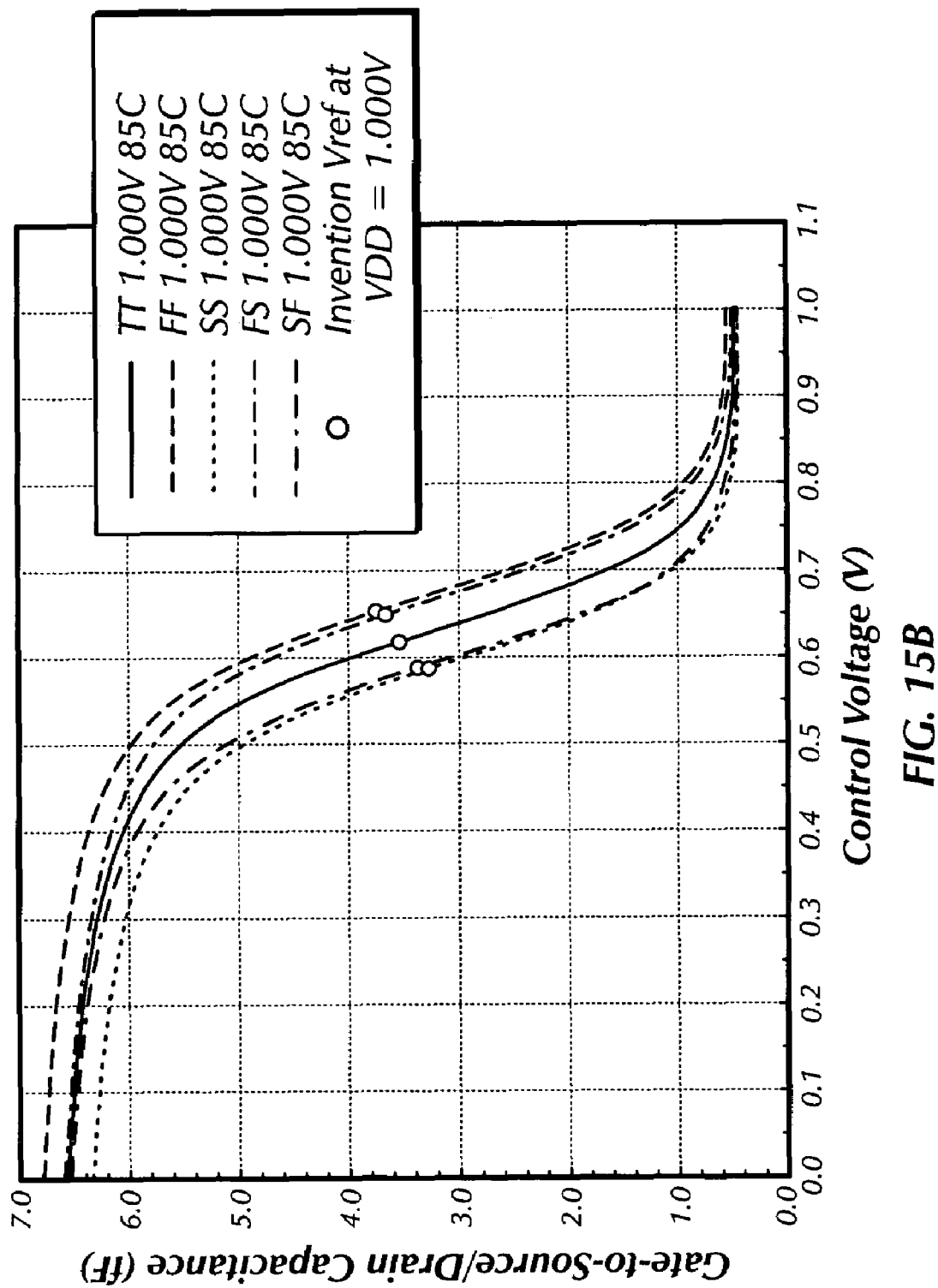
FIG. 15B displays simulation results of design examples of proposed invention at supply voltage VDD of 1.000V.
Figure 15C:
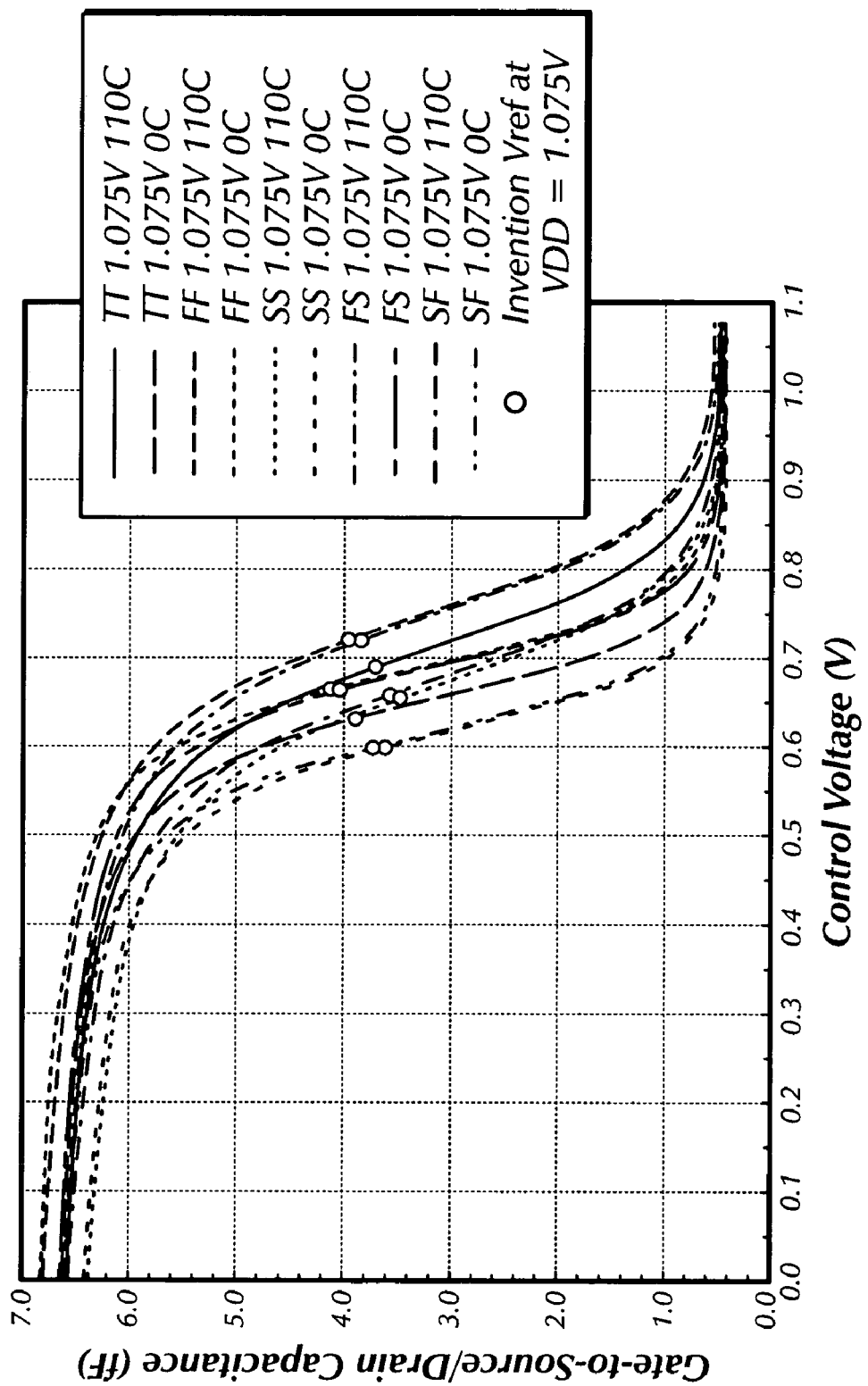
FIG. 15C displays simulation results of design examples of proposed invention at supply voltage VDD of 1.075V.

Simulation results are shown in FIGS. 15A, 15B, and 15C at VDD of 0.900V, 1.000V, and 1.075V, respectively, with temperatures ranging from 0° C. to 110° C. across acceptable process variations. Simulations from five statistically acceptable process corners are reported: TT (typical nFET and typical pFET), FF (fast nFET and fast pFET), SS (slow nFET and slow pFET), FS (fast nFET and slow pFET), and SF (slow nFET and fast pFET). These corners are associated with $V_T$ statistical variations that can be expected on production material. Circles indicate $V_{REF}$ values for C-V characteristics of the MOS varactor corresponding to a particular PVT condition. The results in FIG. 15 convincingly demonstrate that the generated $V_{REF}$ safely falls in the middle of C-V transition between inversion and depletion, thereby providing ample bi-directional tuning.

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A voltage-controlled oscillator (VCO) control semiconductor integrated circuit for biasing a varactor, comprising:
   a diode-clamped FET comprising a gate, a drain, and a source, the gate and drain being operatively connected to one another;
   a current source operatively coupled to the source of the diode-clamped FET at a connection point and configured to produce a reference voltage at the connection point and a constant current through the diode-clamped FET;
   an output coupled to the connection point and configured to provide the reference voltage to an input of the varactor as a biasing voltage;
   wherein a threshold voltage, $V_t$, of the varactor is higher than a threshold voltage, $V_t$, of the diode-clamped FET.

2. The VCO control semiconductor integrated circuit of claim 1, wherein the diode-clamped FET is implemented as a diode-clamped nFET.

3. The VCO control semiconductor integrated circuit of claim 1, wherein the diode-clamped FET is implemented as a diode-clamped pFET.

4. The VCO control semiconductor integrated circuit of claim 1, wherein the diode-clamped FET further has an impedance associated therewith and the current source has an impedance associated therewith, the impedance of the current source being a multiple of 5 or greater than the impedance of the diode-clamped FET.

5. The VCO control semiconductor integrated circuit of claim 4, wherein at least one of the impedance of the FET and the impedance of the current source is implemented with a passive device.

6. The VCO control semiconductor integrated circuit of claim 4, wherein at least one of the impedance of the FET and the impedance of the current source is implemented with an active device.

7. The VCO control semiconductor integrated circuit of claim 1, wherein the diode-clamped FET and the varactor are substantially the same size.

8. The VCO control semiconductor integrated circuit of claim 1, further comprising at least a second FET, and wherein the combination of the diode-clamped FET and the at least second FET has a first size substantially the same as a second size of the varactor.

9. The VCO control semiconductor integrated circuit of claim 1, wherein the circuit forms a portion of a phase-locked loop control circuit.

10. A method of operating a voltage-controlled oscillator (VCO) control semiconductor integrated circuit for biasing a varactor, comprising:
    operating a biasing circuit, the biasing circuit comprising a diode-clamped FET comprising a gate, a drain and a source, the gate and drain being operatively connected to one another, a constant current source operatively coupled to the source of the diode-clamped FET at a connection point and configured to produce a reference voltage at the connection point and a constant current through the diode-clamped FET, and a output coupled to the connection point and configured to provide the reference voltage to an input of the varactor as a biasing voltage;
    establishing the reference voltage in response to the biasing circuit being operated, the reference voltage being a sum of one gate overdrive voltage and a threshold voltage above ground;
    providing the reference voltage to the input of the varactor;
    tracking an ideal voltage in the varactor in response to the reference voltage being provide thereto;
    wherein a threshold voltage, $V_t$, of the varactor is higher than a threshold voltage, $V_t$, of the diode-clamped FET.

11. The method of claim 10, wherein the diode-clamped FET is implemented with a diode-clamped pFET.

12. A method of operating a voltage-controlled oscillator (VCO) control semiconductor integrated circuit for biasing a varactor, comprising:
    operating a biasing circuit, the biasing circuit comprising a diode-clamped FET comprising a gate, a drain and a source, the gate and drain being operatively connected to one another, a constant current source operatively coupled to the source of the diode-clamped FET at a connection point and configured to produce a reference voltage at the connection point and a constant current through the diode-clamped FET, and a output coupled to the connection point and configured to provide the reference voltage to an input of the varactor as a biasing voltage;
    establishing the reference voltage in response to the biasing circuit being operated, the reference voltage being one $V_t$ below $V_{DD}$;
    providing the reference voltage to the input of the varactor;
    tracking a threshold voltage in the varactor in response to the reference voltage being provide thereto;
    wherein a threshold voltage, $V_t$, of the varactor is higher than a threshold voltage, $V_t$, of the diode-clamped FET.

13. The method of claim 12, wherein operating the biasing circuit further comprises forcing a fixed current through the VCO control circuit.

14. The method of claim 12, wherein operating the biasing circuit further comprises using a current source to force a fixed current through the VCO control circuit.

15. The method of claim 12, wherein the operating biasing circuit further comprises using a passive resistance device to force a fixed current through the VCO control circuit.

16. The method of claim 12, wherein step of operating the biasing circuit further comprises using an active resistance device to force a fixed current through the VCO control circuit.

17. The method of claim 12, wherein operating the biasing circuit further comprises using a passive resistance device to force a fixed current through the VCO control circuit, the passive resistance device having an AC resistance at least two times greater than an AC resistance associated with the biasing circuit.

* * * * *